US 6,549,447 B1

(12) United States Patent
Fricke et al.

(10) Patent No.: US 6,549,447 B1
(45) Date of Patent: Apr. 15, 2003

(54) MEMORY CELL STRUCTURE (76) Inventors: Peter Fricke, 7101 Rhoda Way, Corvallis, OR (US) 97330; Andrew L Van Brocklin, 6050 NW. Valley Dr., Corvallis, OR (US) 97330

( * ) Notice: Subject to any disclaimer, the term of this patent is extended or adjusted under 35 U.S.C. 154(b) by 0 days.

(21) Appl. No.: 10/001,740

(22) Filed: Oct. 31, 2001

(51) Int. Cl.[7] .............................. G11C 17/06; G11C 5/02
(52) U.S. Cl. ......................................... 365/105; 365/51
(58) Field of Search ................................. 365/105, 173, 365/225.7, 51, 63, 103, 114

(56) References Cited

U.S. PATENT DOCUMENTS

| | | | |
|---|---|---|---|
| 4,792,841 A | * 12/1988 | Nagasawa et al. | 365/154 |
| 5,311,465 A | * 5/1994 | Mori et al. | 365/174 |
| 5,625,220 A | 4/1997 | Liu et al. | 257/530 |
| 5,734,605 A | * 3/1998 | Zhu et al. | 365/158 |
| 5,835,396 A | 11/1998 | Zhang | 365/51 |
| 5,926,414 A | 7/1999 | Shin | 365/185.17 |
| 5,978,257 A | * 11/1999 | Zhu et al. | 365/173 |
| 6,002,607 A | 12/1999 | Dvir | 365/103 |
| 6,034,882 A | 3/2000 | Johnson et al. | 365/103 |
| 6,097,625 A | * 8/2000 | Scheuerlein | 365/171 |
| 6,185,121 B1 | 2/2001 | O'Neill | 365/94 |
| 6,185,122 B1 | 2/2001 | Johnson et al. | 365/103 |
| 6,236,590 B1 | * 5/2001 | Bhattacharyya et al. | 365/158 |
| 6,404,674 B1 | * 6/2002 | Anthony et al. | 365/173 |

* cited by examiner

Primary Examiner—David Nelms
Assistant Examiner—Thong Le
(74) Attorney, Agent, or Firm—Timothy F. Myers (57) ABSTRACT

A memory cell has a first and second conductor. The first conductor is oriented in a first direction and the second conductor is oriented in a second direction. The first conductor has at least one edge. A state-change layer is disposed on the first conductor and a control element is partially offset over the at least one edge of the first conductor. The control element is disposed between the first and second conductors. Preferably the state-change layer is a direct-tunneling or dielectric rupture anti-fuse. A memory array can be formed from a plurality of the memory cells. Optionally, creating multiple layers of the memory cells can form a three-dimensional memory array.

29 Claims, 9 Drawing Sheets

MEMORY CELL STRUCTURE

BACKGROUND OF THE INVENTION

As computer and other electrical equipment prices continue to drop in price, the manufacturers of storage devices, such as memory and hard drives, are forced to lower the cost of their components. At the same time, the computer, game, television and other electrical device markets are requiring larger amounts of memory to store images, pictures, movies, music, and other data intensive files. Thus, besides reducing cost, manufactures of storage devices must also increase the storage density of their devices. This trend of increasing memory storage while at the same time reducing the cost required to create the storage has been continuous for over 20 years and will continue into the future. However, most conventional memory technologies such as magnetic disk storage, dynamic random-access memory, and even optical storage such as CD-ROMs, CD-R, CD-R/W and DVD variants are being challenged by physical limitations and high slot costs. To further increase storage density while also decreasing the cost of fabrication, a need exists to create new memory cell structures that can overcome the physical limitations imposed with conventional technology.

SUMMARY OF THE INVENTION

A memory cell has a first and second conductor. The first conductor is oriented in a first direction and the second conductor is oriented in a second direction that is substantially orthogonal to the first conductor. The first conductor has at least one edge. A state-change layer is disposed over the first conductor. A control element is partially offset over at least one edge of the second conductor. The control element is disposed between the first and second conductors. Preferably the state-change layer is a direct-tunneling junction, Lecomber tunneling junction, dielectric rupture anti-fuse switch, or phase-change switch. A memory array can be formed from a plurality of the memory cells. Optionally, creating multiple layers of the memory cells can form a three-dimensional memory array.

BRIEF DESCRIPTION OF THE DRAWINGS

The invention is better understood with reference to the following drawings. The elements of the drawings are not necessarily to scale relative to each other. Rather, emphasis has instead been placed upon clearly illustrating the invention. Furthermore, like reference numerals designate corresponding similar parts through the several views.

DETAILED DESCRIPTION OF PREFERRED EMBODIMENTS

The semiconductor devices of the present invention are applicable to a broad range of semiconductor devices technologies and can be fabricated from a variety of semiconductor materials. The following description discusses several presently preferred embodiments of the semiconductor devices of the present invention as implemented in silicon substrates, since the majority of currently available semiconductor devices are fabricated in silicon substrates and the most commonly encountered applications of the present invention will involve silicon substrates. Nevertheless, the present invention may also advantageously be employed in gallium arsenide, germanium, and other semiconductor materials. Accordingly, the present invention is not intended to be limited to those devices fabricated in silicon semiconductor materials, but will include those devices fabricated in one or more of the available semiconductor materials and technologies available to those skilled in the art, such as thin-film-transistor (TFT) technology using polysilicon on glass substrates or organic semiconductors on cellulose film.

It should be noted that the drawings are not true to scale. Further, various parts of the active elements have not been drawn to scale. Certain dimensions have been exaggerated in relation to other dimensions in order to provide a clearer illustration and understanding of the present invention.

In addition, although the embodiments illustrated herein are shown in two-dimensional views with various regions having depth and width, it should be clearly understood that these regions are illustrations of only a portion of a device that is actually a three-dimensional structure. Accordingly, these regions will have three dimensions, including length, width, and depth, when fabricated on an actual device. Moreover, while the present invention is illustrated by preferred embodiments directed to active devices, it is not intended that these illustration be a limitation on the scope or applicability of the present invention. It is not intended that the active devices of the present invention be limited to the physical structures illustrated. These structures are included to demonstrate the utility and application of the present invention to presently preferred embodiments.

The embodiments of the invention are directed to concentrating the amount of energy used to alter state-change material used in memory cells. The memory cells may be one-time programmable cells (write once) or read/write programmable depending on the state-change material used. For a one-time programmable cell, one preferable embodiment uses a diode control element and anti-fuse oxide junction in series. Another preferable embodiment uses a tunnel junction control element in place of the diode. The anti-fuse oxide junction is programmed by supplying sufficient energy to form a filament through the oxide for data retention. The filament changes the resistance of the memory cell that is sensed and detected by the memory read circuitry to determine the programmed state of the memory cell. The amount of energy required to create the filament through the oxide is related to the thermal characteristics of the structure. The embodiments of the invention each optimize the amount of energy directed to the state-change element by concentrating electrons at a specific location. This concentration of electrons provides localized heating. The localized heating provides for faster programming of the state-change element, such as filament formation with the anti-fuse oxide junction. Because prior solutions self-align the control element and state-change element, thermal energy was dispersed across the entire state-change element and not locally focused. Thus, prior solutions required more energy and longer programming times to change the state of the state-change element. Through use of the invention, less thermal energy is required to change the state of the state-change element thereby increasing performance by decreasing the amount of time required to write information within the memory cell. This change in performance is significant when the memory cell is used in large memory arrays.

The embodiments of the invention increase the electric field formed during programming by utilizing structures that offset the state-change element and the diode. This structure is particularly useful in forming high density vertical memory arrays. The memory arrays are preferably fabricated vertically in memory layers above a standard silicon substrate such as a processed CMOS wafer. Other substrates are known to those skilled in the art and can be substituted without changing the spirit and scope of the invention. Preferably, the state-change element embodies semiconductor tunneling junctions and control elements such as PiN, PN junction diodes or tunnel junction devices. PiN diodes are preferable when requiring minimized reverse leakage currents that result in improved signal to noise ratios and ultimately simpler memory array sensing circuits. Any of a number of other current limiting devices are optional. The PiN diodes also provide a high series resistance in the memory cell, thereby reducing power requirements and allowing for faster sensing due to the increased signal to noise ratios. Tunnel junction devices utilized as control elements generally provide for simpler processing and lower manufacturing costs.

Different state-change devices can be fabricated such as direct tunneling oxide layers, dielectric rupture devices, LeComber and silicide switches, and phase-change elements. The phase-change elements provide for read-write capability.

More details of the invention and its resulting benefits will become more apparent in the following detailed description of the preferred and alternative embodiments of the invention.

Figures 1A, 1B:
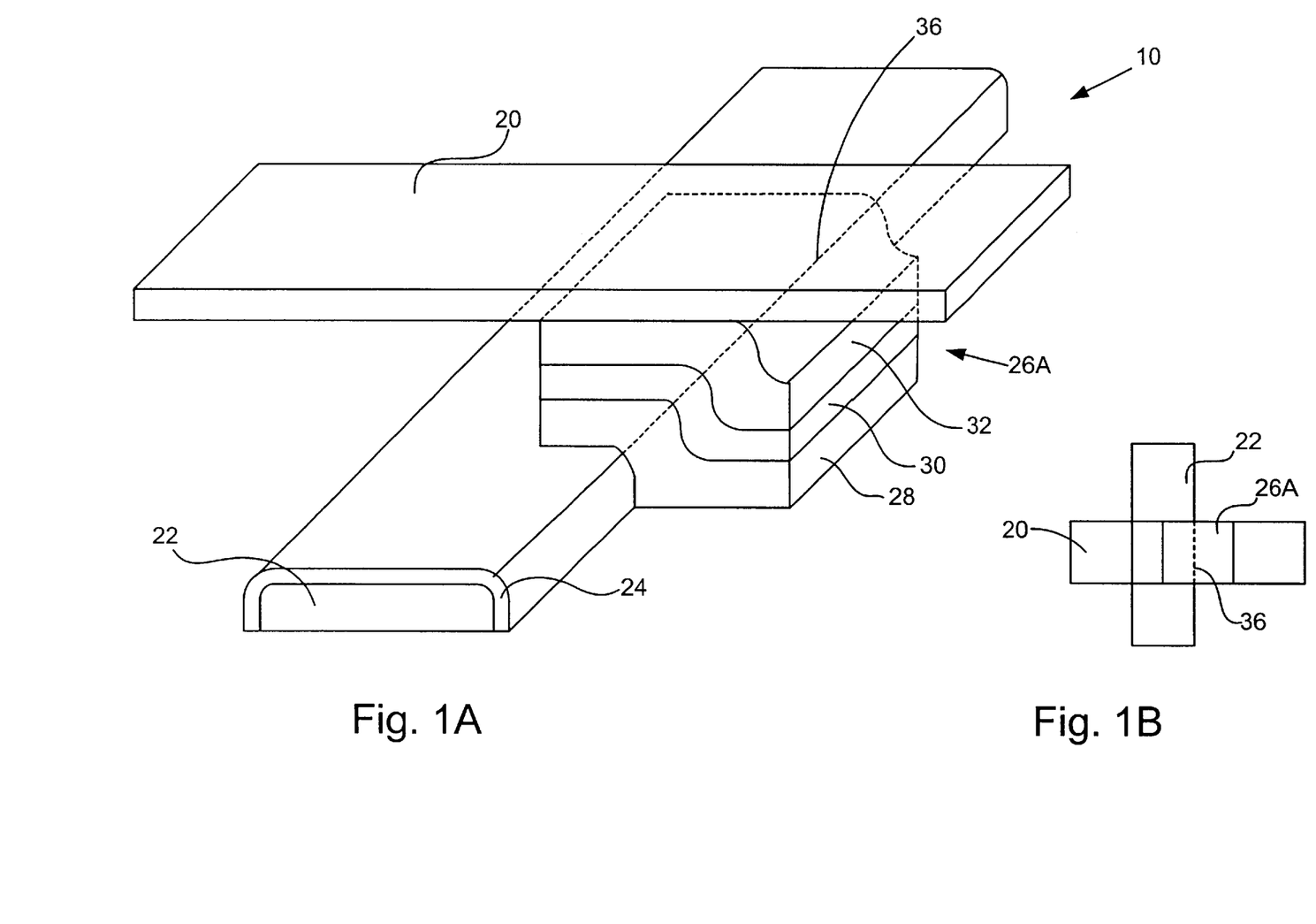
FIG. 1A is a perspective view of a first embodiment of the invention.
FIG. 1B is a top view of the first embodiment illustrated in FIG. 1A.

FIG. 1A is a perspective view of a first embodiment 10 of a memory cell that incorporates the invention. FIG. 1B is a top view of the first embodiment 10 shown in FIG. 1A. A first conductor 22 and a second conductor 20 form a row and column of a memory array. The second conductor 20, either designated as a column or row line, is oriented in a first direction. A first conductor 22 is oriented in a second direction substantially orthogonal to the first direction. The first conductor 22 has at least one edge 36. A state-change layer 24 is disposed on the first conductor 22 over its entire exposed surface including at least one edge 36. Alternatively, the state-change layer 24 is partially offset from the top of the first conductor 22 and overlaps the at least one edge 36. A control element 26A is disposed between the first and second conductors 20, 22 and partially offset over at least one edge 36. The control element is preferably a PiN diode comprised of an N layer 28, an intrinsic layer 30, and a P layer 32. Other control elements such as PN diodes, tunnel junction devices, resistors, or Schottky diodes exist and can be substituted for the PiN diode and still meet the scope and spirit of the invention. For instance, control element 26A can be a tunnel junction device wherein layer 28 is a metal layer, layer 30 is a thin oxide layer, and layer 32 is another metal layer.

The first conductor 22 can be either a row or column conductor. Preferably the first conductor 22 has an oxide layer (alumina ($Al_2O_3$) in the case of an aluminum (Al) conductor) that is fabricated directly on the top exposed surface of the entire first conductor 22. Preferably the first and second conductors 20, 22 are formed of aluminum, copper, or silicide and alloys thereof although other conductive metals or semiconductors can be used. The oxide layer forms the state-change element 24. Preferably, the fabrication of the oxide layer is performed after the first conductor 22 has been etched to allow for coverage over the sidewalls of the first conductor 22. Preferably, the PiN diode is fabricated using a ramped doped amorphous, microcrystalline silicon, or laser annealed process to place the PiN partially on the first conductor 22 and partially on the substrate. A tunnel junction control element is typically formed by a metal/oxide/metal interface and for some embodiments may be the preferred control element.

When formed as an oxide layer, the state-change element 24 preferably utilizes electron tunneling or alternatively dielectric rupture dynamics. Most preferably, the electron tunneling is direct tunneling thereby requiring that the oxide layer thickness be minimal, such as about 5 to about 50 Angstroms. Such a state-change element 24 creates an anti-fuse structure with preferable current/voltage characteristics. At a low voltage potential across the oxide layer, such as during reading of the memory cell, the current is in the low microampere or high nanoampere range and is thus efficient for power. When the anti-fuse is programmed by creating filaments through the oxide, the current is in the high microampere or low milliamp range. This change in current levels creates a very good signal to noise ratio for sensing whether the oxide is programmed as a logical 0 or 1 state. At higher voltage potentials, such as during programming, the oxide layer begins to have higher current flows due to the tunneling current. This tunneling current creates a flow of electrons that locally heats the state-change element 24, the oxide, and forms the conductive filaments through the oxide. When sufficient energy is forced across the oxide barrier to sufficiently heat the fusing site, a conducting filament is formed through the oxide and the state of the oxide is changed permanently for a one-time programmable structure.

Alternative state-change technologies can be used. For example, the state-change element 24 can be either a read only LeComber or silicide switch, or a read/writeable phase-change material. One method of forming a LeComber switch is to deposit a thin layer of amorphous intrinsic silicon on the first conductor 22, preferably a layer of metal such as Chromium (Cr). Then a separate metal, such as gold (Ag) is deposited on the amorphous intrinsic silicon. Before programming, the LeComber switch acts as a reversed biased tunnel diode. Creating an enhanced concentrated electric field through the amorphous silicon with the invention will cause a conductive path to form or allow for hopping conduction, thus creating the anti-fuse.

One preferable phase-change material for a read/writeable state-change element is germanium telluride (GeTe), which can be reversibly changed from a semiconducting (amorphous) to a metallic (crystalline) state by heating and cooling it at a proper rate. For example, if the GeTe is doped so that it is p-type when in its semiconducting state and is deposited on top of an n-type semiconductor-layer, then a large contrast will be seen in the number of carriers swept across the junction if the GeTe is changed to its metallic state. By using GeTe or equivalent phase-change material, the memory cell is capable of being read-writeable, e.g. being capable of writing, erasing, writing many times. This function increases the utility of the memory cell structure for some applications. Other phase-change materials can be substituted for GeTe and still meet the spirit and scope of the invention. Some examples of other preferable phase-change materials are chalcogenide alloys such as: GaSb, InSb, InSe, $Sb_2Te_3$, $Ge_2Sb_2Te_5$, InSbTe, GaSeTe, $SnSb_2Te_4$, InSbGe, AgInSbTe, (GeSn)SbTe, GeSb(SeTe), $Te_{81}Ge_{15}Sb_2S_2$ and GeSbTe.

Other antifuse structures are possible such as silicide switches. Silicide switches are formed with alternatively stacked silicon and transition metal thin films that change resistance when programmed. Generally, the programming process for a silicide fuse is irreversible. Before writing, the stack of transaction metal and silicon layers has a first resistance. Appropriate row and column lines are selected to force a current through a selected memory cell. The current passing through the selected memory cell creates Joule heat that triggers and completes the silicidation reaction. By using the concentrated electric field created by the invention current is focused and thus the Joule heat is concentrated in a smaller area thereby allowing the programming to be completed in less time than without the invention. The silicidation reaction causes the resistance of the selected memory cell to change to a much lower value. To read the programmed memory cell, a small sense current is supplied to a selected memory cell and the voltage drop across the selected memory cell is sensed. Some preferable silicide compounds are $Ni_2Si$, NiSi, $NiSi_2$, $Pd_2Si$, PdSi, and $Pt_2Si$, and PtSi. Other possible transition metals in various compounds with silicon include Ti, V, Cr, Mn, Fe, Co, Zr, Nb, Mo, Rh, Hf, Ta, W, and Ir.

Figure 2:
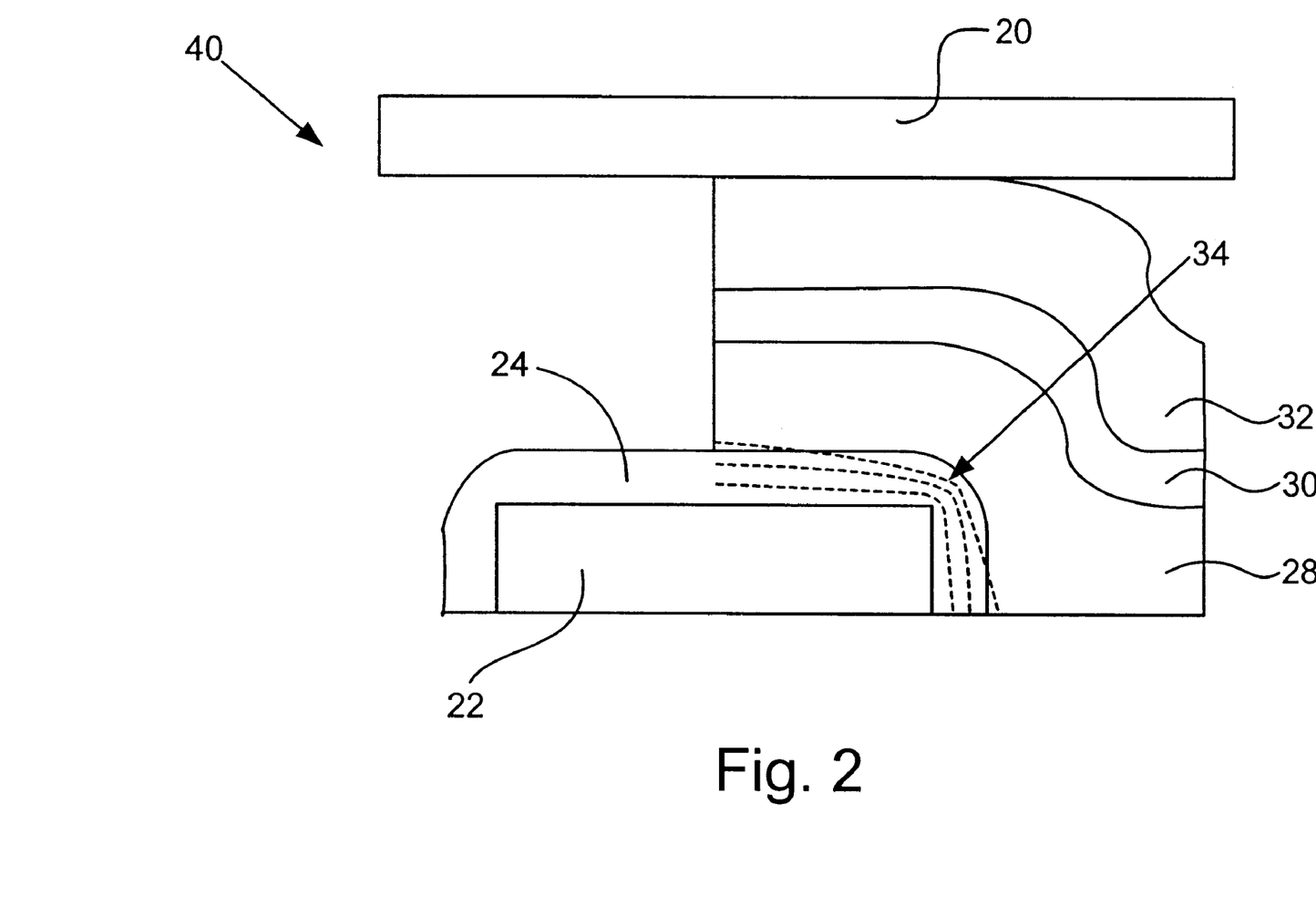
FIG. 2 is a cross-sectional view of the first embodiment illustrated in FIG. 1A demonstrating one feature of the invention.

FIG. 2 illustrates one feature of the invention used in the first embodiment of a memory cell 40. First conductor 22 has a state-change element 24 disposed on its exposed surface including at least one edge 36. The state-change element 24 is preferably formed by growth or deposition of one or more layers of material that is responsive to electric fields or thermal energy. By applying a voltage to the first conductor 22, at least one edge 36 causes the electric field generated to be increased as shown by the equipotential lines of electric field 34. By localizing the intensity of the electric field 34 using the at least one edge 36, electrons are focused across a smaller area than without the edge(s) thus reducing or lowering the amount of energy required to change the state of the state-change element 24 to program a logic 0 or 1.

The memory cell 40 has a second conductor 20 and a first conductor 22 disposed normal to the second conductor 20. A state-change element 24 is disposed between the second conductor 20 and the first conductor 22 and is substantially aligned with the first conductor 22. A control element 26A, here a PiN diode is partially disposed between the second conductor 20 and the state-change element 24. The control element 26A is partially offset over the state-change element 24. The control element 26A is preferably an amorphous or microcrystalline material formed in one process step with doping ramped of an N-doped material 28, an intrinsic silicon (substantially no dopant or minimal P or N doping) material 30, and a P-doped material 32. Preferably the state-change element 26A is a layer formed by oxidizing he first conductor 22 for a write-once cell or a depositing a phase-change material for a read/write cell. Alternatively, a thin layer of material is deposited on the first conductor 22 then completely oxidized to form the state-change element 26A. In either approach, the thickness of the layer oxidized determines whether the state-change layer is a direct-tunneling anti-fuse or a dielectric rupture anti-fuse. A thin layer of about 5 to about 50 Angstroms provides for direct tunneling. A thickness of greater than about 50–100 Angstroms creates a dielectric rupture anti-fuse that requires a large electric field to create a dielectric breakdown of the oxide layer. An array of memory is formed by combining a plurality of memory cells 40 into a matrix of rows and columns. Further density can be created by vertically stacking the memory cells 40 in a three dimensional array.

Alternatively, the memory cell 40 can be described as including a first conductor 22 having a first width and a second conductor 20 having a second width. The control element 26A has a first end surface with first opposite edges spaced apart by a distance about equal to the second width and second opposite edges spaced apart by a distance approximately equal to the first width. The first end surface is in contiguous contact with the second conductor. The control element 26A has a second end surface opposite the first end surface. The state-change element 24 is connected in series with the control element 26A. The state-change element 24 is disposed over the first conductor and partially contacts the second end surface of the control element 26A. This results in the control element 26A and the state-change element 24 being offset in vertical alignment.

The memory cell 40 has a first conductor 22 capable of creating an electric field. The control element 26A provides a method of controlling current to the second conductor 20. The memory cell 20 has a method of storing a state-change using the electric field of the first conductor 22. The method of storing the state-change is disposed between the method of controlling current and the first conductor 22. The memory cell 40 provides a method of enhancing the electric field of the first conductor 22. This method of enhancing the electric field is preferably performed by using at least one edge of the first conductor 22 and by offsetting the method for controlling current over at least one edge to concentrate the current in a portion of the state-change element 24.

Figures 3A, 3B:
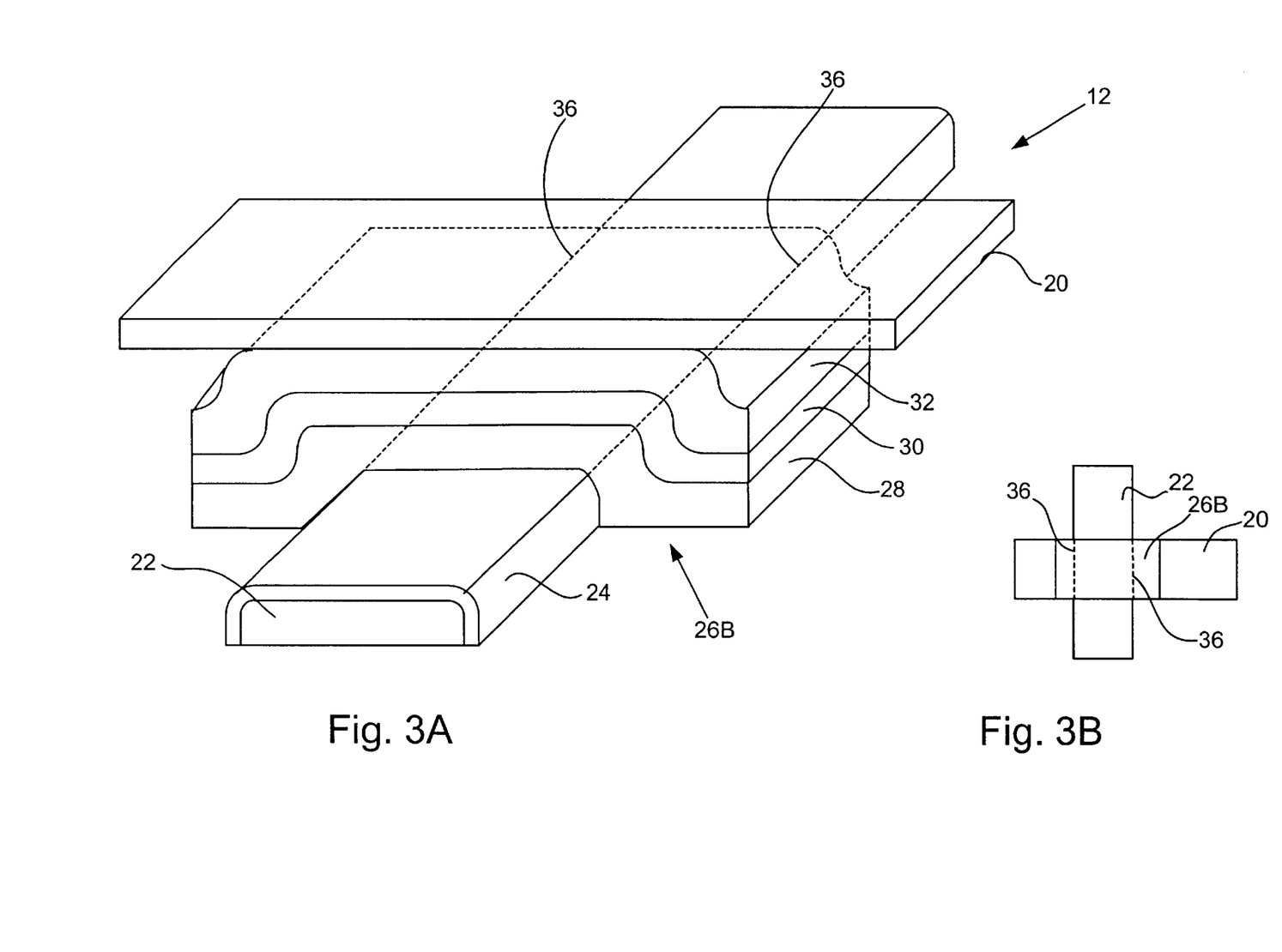
FIG. 3A is a perspective view of a second embodiment of the invention.
FIG. 3B is a top view of the second embodiment of the invention illustrated in FIG. 3A.

FIG. 3A is a perspective view of a second embodiment 12 of the invention and FIG. 3B is a top view of FIG. 3A where a control element 26B is offset over at least two edges of first conductor 22. Second conductor 20 is disposed orthogonal to first conductor 22. State-change element 24 is disposed on and surrounds the exposed surface of first conductor 22. A control element 26B is disposed between the second conductor 20 and the state-change element 24. The control element 26B is partially offset over edges 36. The control element 26B is formed of an amorphous or microcrystalline semiconductor that is preferably formed in a single controlled ramped doping process. This ramped doping process creates a first polarity layer, such as N doped layer 28, a substantially non or minimally doped intrinsic layer 30, and a second polarity layer, such as P doped layer 32. One advantage of this embodiment is that more area of the state-change element 24 is exposed to a concentrated enhanced electric field by providing for more than one edge. A disadvantage is that the memory cell spacing in a memory array is potentially increased.

Figures 4A, 4B:
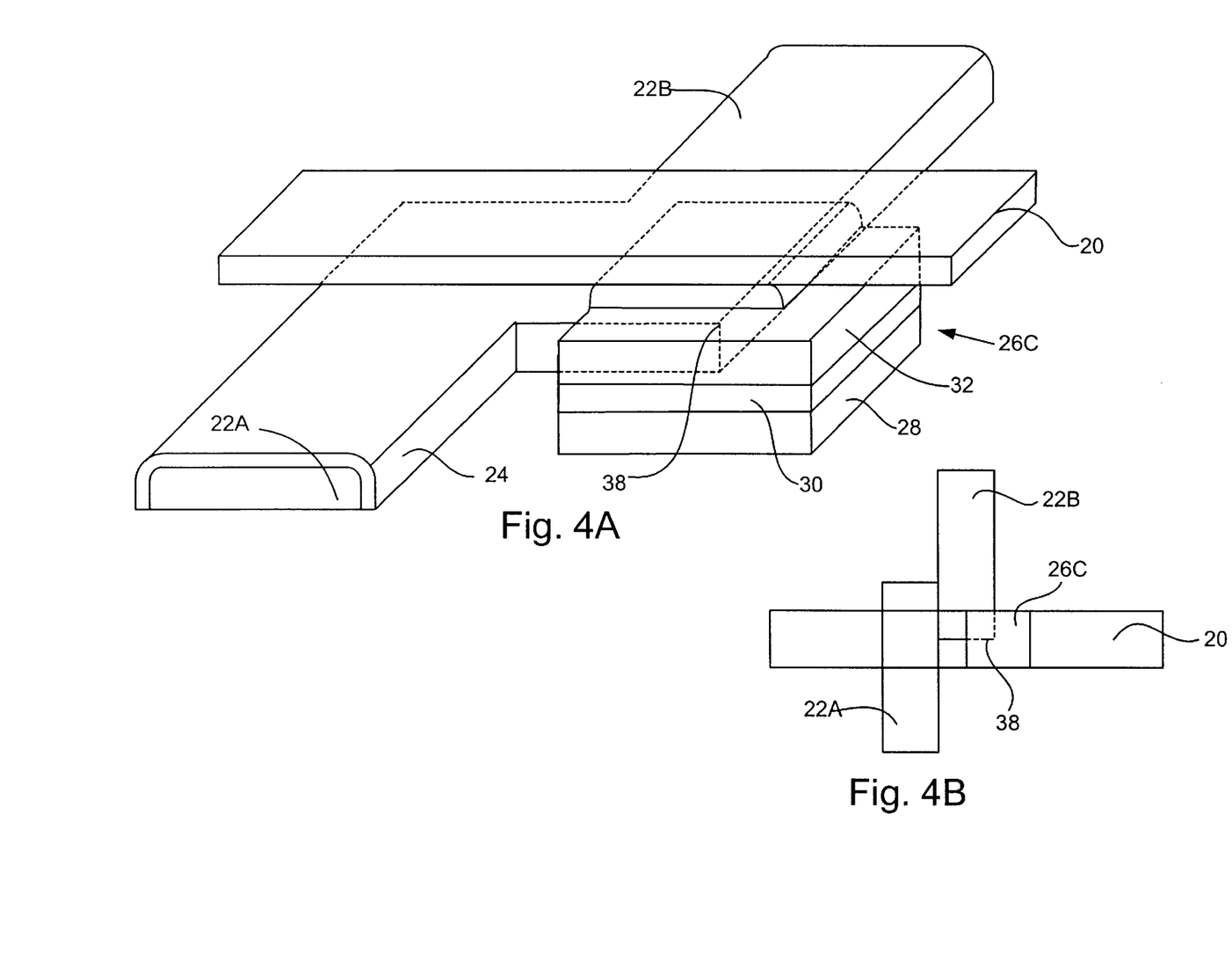
FIG. 4A is a perspective view of a third embodiment of the invention.
FIG. 4B is a top view of the third embodiment of the invention illustrated in FIG. 4A.

FIG. 4A is a perspective view of a third embodiment 14 of a memory cell. The top view of the memory cell is illustrated in FIG. 4B. In this embodiment, first conductor 22 is formed of two segments 22A and 22B that create a 90-degree corner 38. This 90-degree corner is preferably disposed beneath the second conductor 20. The state-change element 24 is disposed on the external surface of first conductor 22. Disposed between the second conductor 20 and the state-change element 24 is a control element 26C that is partially disposed over the 90-degree corner and partially over the substrate. Again, preferably the control element 26C is a PiN diode formed with an N layer 28, an intrinsic layer 30 and a P-layer 32. When applying a voltage to first conductor 22 and by using a 90-degree corner 38, the electric field generated is enhanced even further than with using a single edge. This enhancement is due to the intersection of the three exposed surfaces of first conductor 22 to form the 90-degree corner 38. Each segment of the second conductor, 22A and 22B, are disposed orthogonal to second conductor 20.

Figures 5A, 5B:
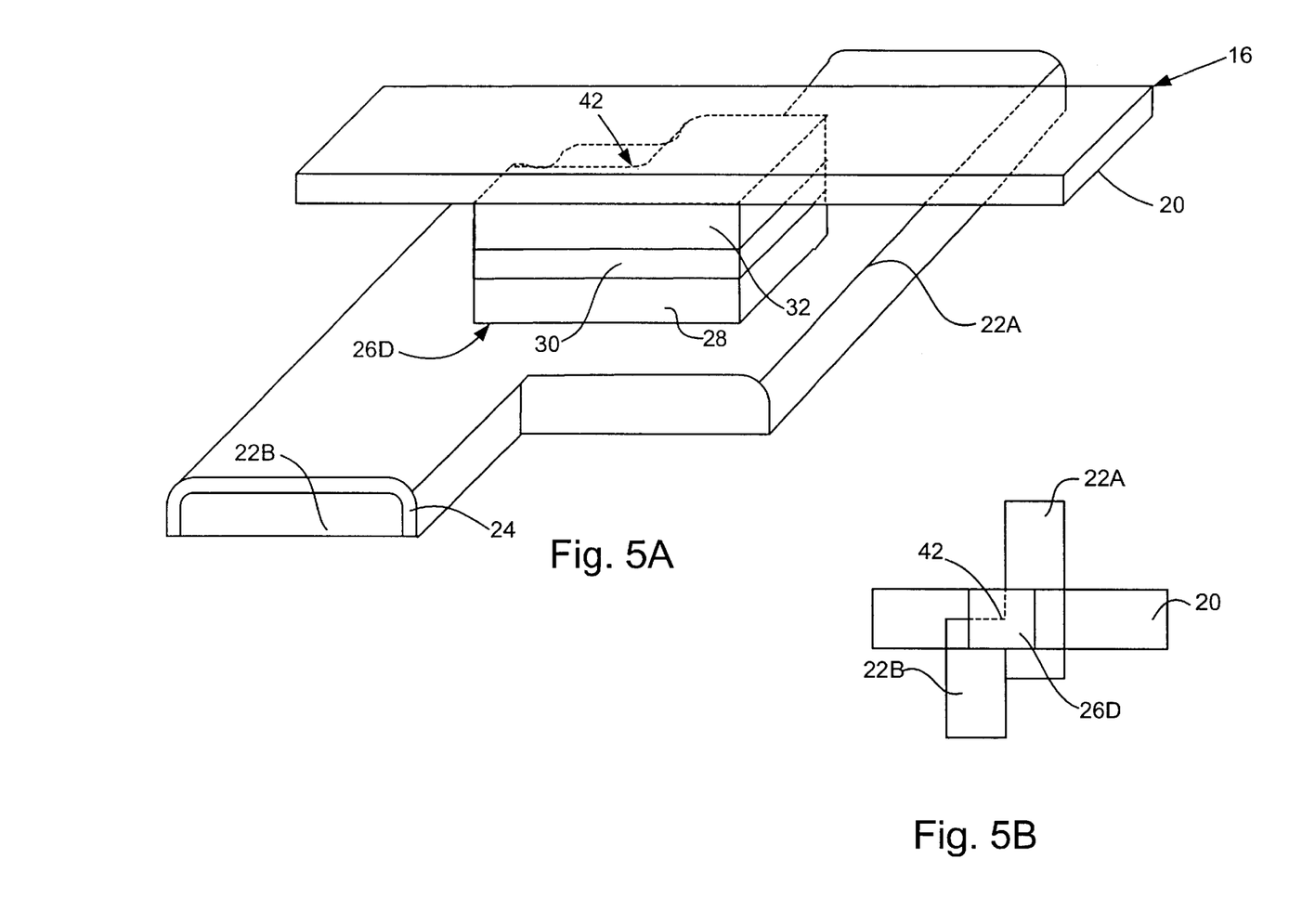
FIG. 5A is a perspective view of a fourth embodiment of the invention.
FIG. 5B is a top view of the fourth embodiment of the invention illustrated in FIG. 5A.

FIGS. 5A and 5B illustrate a fourth embodiment 16 of a memory cell that incorporates aspects of the invention. In this embodiment, the control element 26D is disposed over an inner corner of the intersection of first conductor segments 22A and 22B. The second conductor 20 is disposed substantially orthogonal to the first conductor segments 22A and 22B. The state-change element 24 is disposed on the exposed surfaces of first conductor 22A/22B. The control element 26D is disposed between the second conductor 20 and the state-change element 24. This embodiment has similar advantages and disadvantages as the third embodiment 14.

Figure 6:
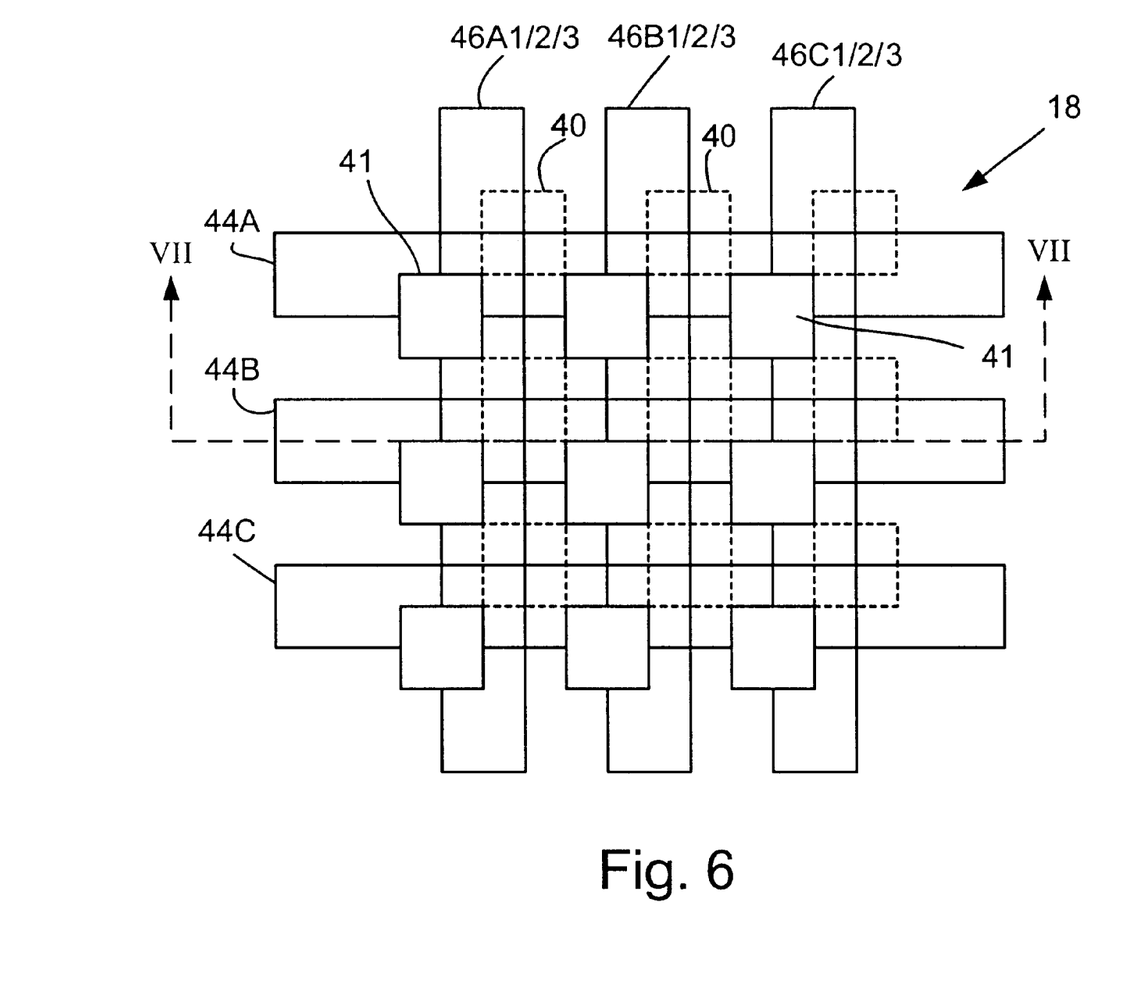
FIG. 6 is a top view of a memory array using the first embodiment of the invention.
Figure 7:
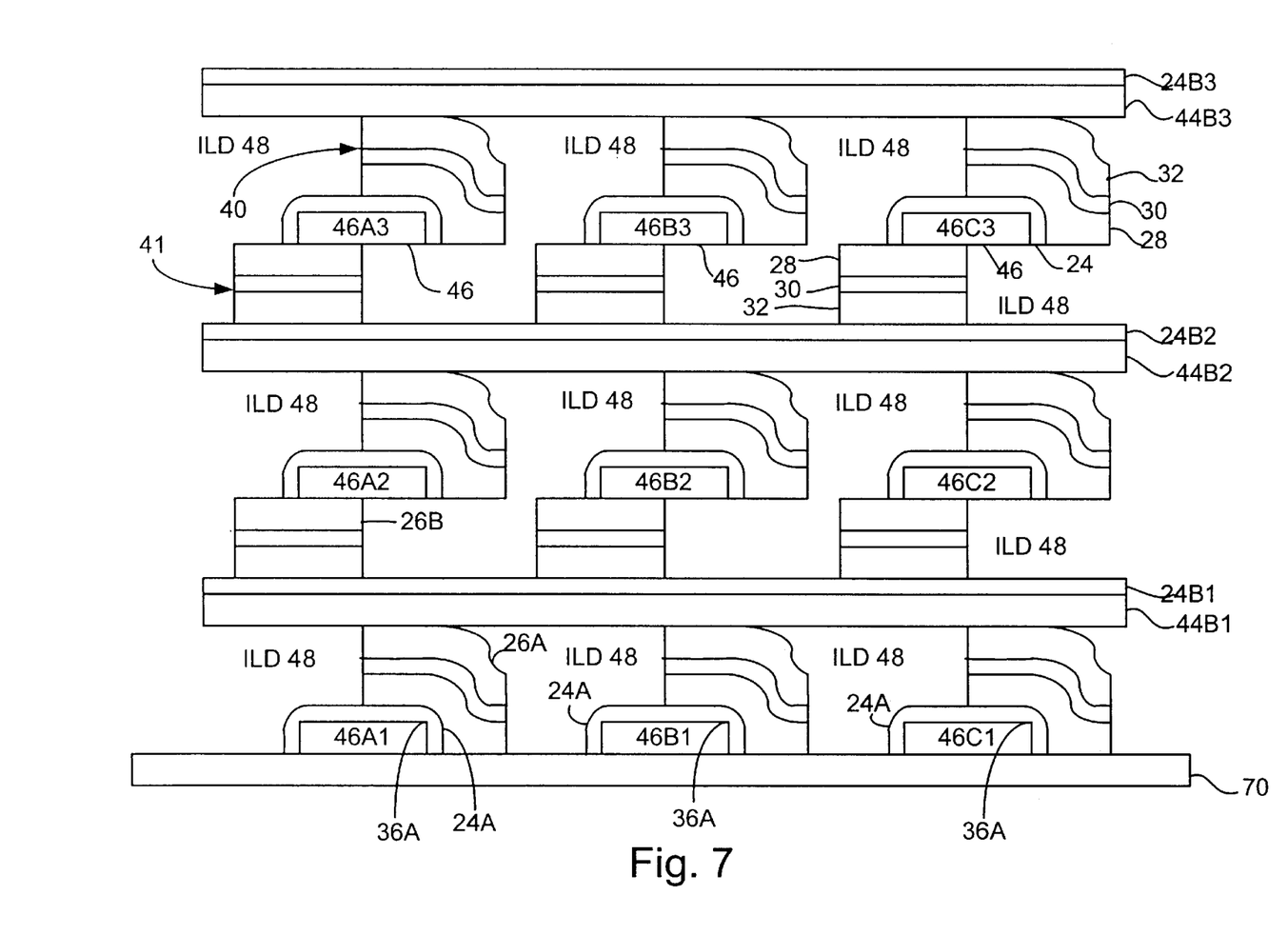
FIG. 7 is cross-sectional view of the memory array of FIG. 6.

FIG. 6 is an illustration of a memory array 18 made up of rows and columns of a plurality of memory cells 40 distributed in a grid pattern. Row lines 44A–C are oriented in a first direction and parallel to each other. Column lines 46A–C are disposed orthogonal to row lines 44A–C. At a corner of the intersection of the row and columns, a memory cell 40 is disposed such that a portion of the memory cell overlaps an edge of a row line. Also shown is another memory cell 41 that is disposed at an adjacent corner of the intersection of the row and column lines. The memory cell 41 is disposed such that a portion of the memory cell overlaps an edge of a column line. This layout pattern allows for three-dimensional stacking of memory cells by alternately placing the memory cells 40 and 41 on opposite corners. A clearer understanding of the three dimensional construction is illustrated in FIG. 7. FIG. 7 is a cross sectional view of FIG. 6 along the VII—VII perspective for a three-dimensional memory array having five layers of memory cells 40 and 41. A substrate 70, such as a silicon wafer or a processed CMOS circuit, forms a base on which to build a three dimensional memory array using a dual memory cell structure that takes advantage of the memory cells structure of the invention. On the substrate 70 is a first set of one or more conductors 46A1/46B1/46C1 which are oriented in a first direction and has an exposed first surface that includes a set of edges 36A. A set of state-change elements 24A is disposed over the exposed first surface and set of edges 36A. A set of control elements or devices 26A are disposed on the set of state-change elements 24A over the set of edges 36A by being partially offset in alignment. A second set of one or more conductors 44B1 is disposed substantially orthogonal to the first set of conductors 46A1/46B1/46C1. The second set of conductors 44B1 have an exposed second surface with a set of edges 36B (not shown) on which a second 30 state-change element 24B1/24B2/24B3 is disposed thereon. A set of second control elements 26B is disposed on the set of second state-change elements 24B1/24B2/24B3. A third set of one or more conductors 46A2/46B2/46C2 that are essentially parallel to the first set of conductors 46A1/46B1/46C1 are connected to the set of second control elements 26B. Any number of vertical layers used to form the control and state change elements is contemplated within the scope and spirit of the invention. Although the embodiment of the memory array illustrated in FIG. 7 incorporates the embodiment of the memory cell shown in FIGS. 1A–B, the other embodiments shown and described and their equivalents may be substituted and still meet the spirit and scope of the invention. Between the memory cells, an interlayer dielectric (ILD) such as silicon dioxide, silicon nitride, or TEOS (tetraethylorthosilicate) to name only a few, provides isolation and support between memory cells.

By using multiple layers, a three dimensional dual memory cell is formed with a set of three conductors; a first conductor at a first height, a second conductor at a second height and parallel to the first conductor, and a third conductor at a third height and oriented substantially orthogonal to both the first and second conductor and disposed between the first and second heights. A first state-change element is disposed on the first conductor, preferably an oxide coating formed on the first conductor. A second state-change element is disposed on the third conductor, also preferably an oxide coating formed on the third conductor. A first control element, such as a PiN or PN diode is connected to the first state-change element and the third conductor. A second control element is connected to the second state-change element and the second conductor. By adding additional layers, a multiple cell three-dimensional structure is obtained. By patterning the conductors into a matrix of rows and columns a large memory array is formed of alternating rows and columns as illustrated in FIG. 7

Figure 8:
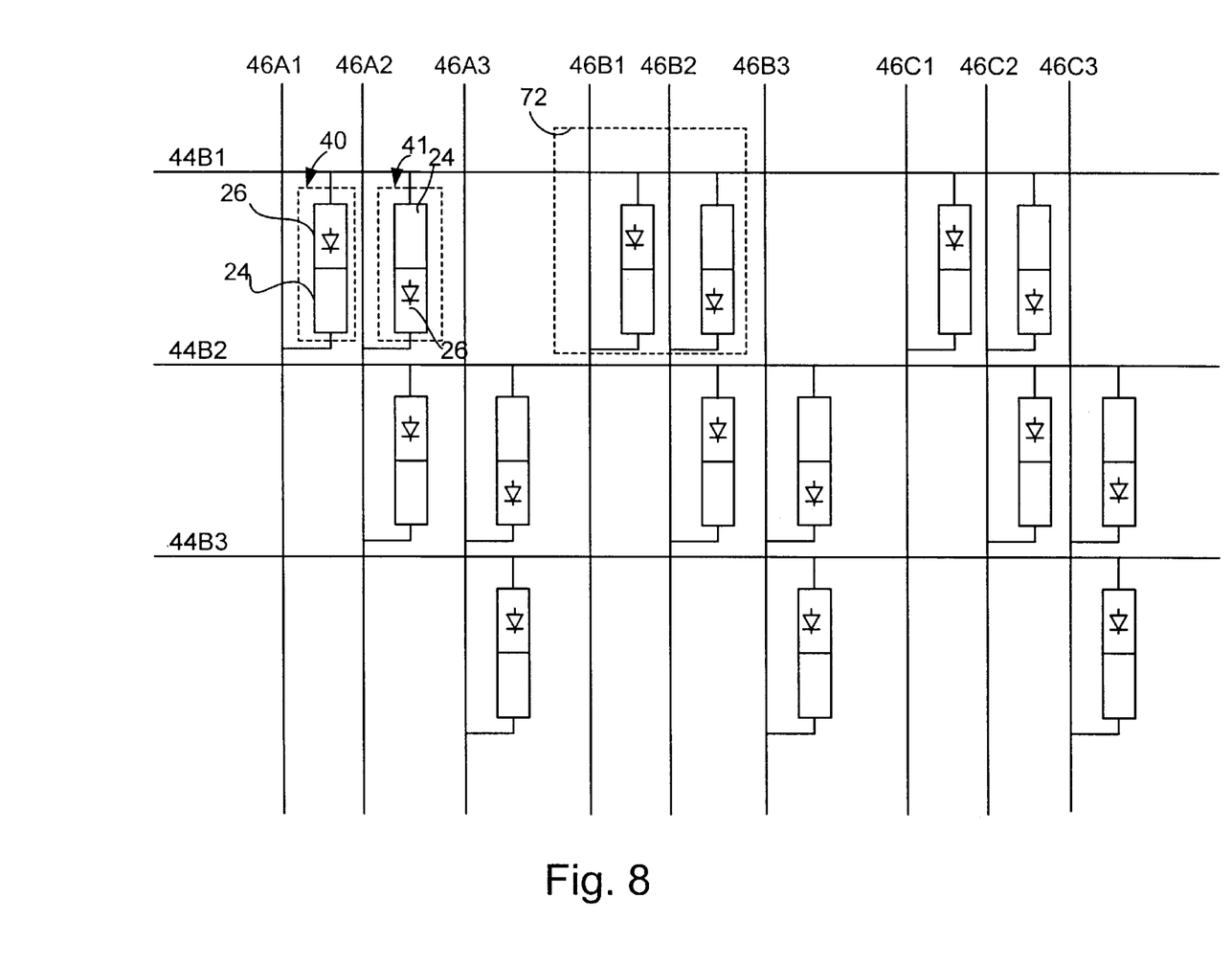
FIG. 8 is an electrical schematic of the memory array shown in FIG. 7.

FIG. 8 is an electrical schematic drawing of the cross-section of the memory array (see FIG. 7) shown in FIG. 6 having 3 levels of rows and 3 levels of a set of 3 columns. A set of row lines 44B1, 44B2, and 44B3 are oriented orthogonal to the set of column lines, 46A1/46A2/46A3, 46B1/46B2/46B3, and 46C1/46C2/46C3. A memory cell 40 is made up of a state-change element 24 and a control element 26. For this embodiment, the control elements 26 are shown as diodes oriented in one direction. Those skilled in the art will appreciate that the diodes shown could be oriented in the opposite direction and the appropriate rows and columns swapped and still meet the spirit and scope of the invention. A dual memory cell 72 includes a memory cell 40 and an alternate memory cell 41. A dual cell is preferably the result of sharing row and column connections.

Figure 9:
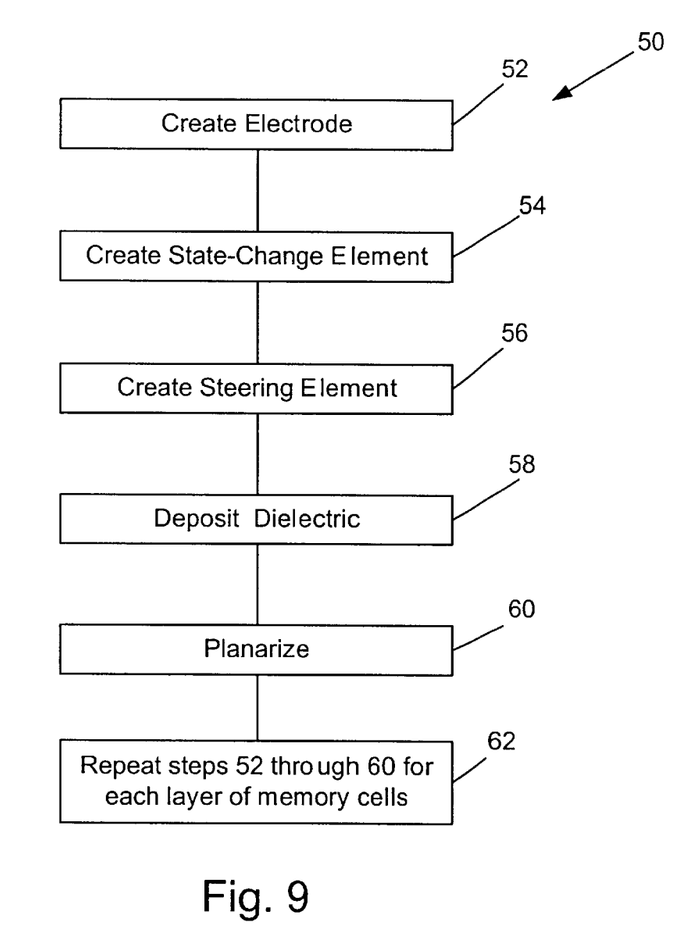
FIG. 9 is a process chart illustrating the steps used to create embodiments of the invention.

FIG. 9 is a flowchart of an exemplary process 50 used to create the memory cells, dual memory cells, and memory arrays previously shown and described. In block 52, first a set of one or more electrodes made of conductive material are created on a substrate oriented in a first direction. In block 54, the state-change element is created on the electrode (conductors) are preferably oxidized using one of several conventional processes known to those skilled in the art to create either a direct tunneling state-change layer or a dielectric rupture type layer over exposed portions of the electrodes including edges. Alternatively, the state-change layer is deposited over the exposed portion of the electrode including the edges to create the state change elements. When using phase-change material such as GeTe, deposition is the preferred method. Next in step 56, a control element is created such that it is partially disposed over the electrodes, including an edge of the electrode and partially beyond the edge of the electrode. In step 58, an interlayer dielectric (ILD) is deposited over the substrate to isolate and support the previously fabricated devices. Next in step 60, the inner layer dielectric is planarized to remove topography features and to ensure a substantially flat surface on which to build the next layer of memory cells. Depending on the type of planarization used, a hard material such as tungsten or tantalum is optionally disposed on the set of electrodes before depositing the dielectric layer. For instance, if aluminum were used to create the electrodes and chemical-mechanical polishing (CMP) planarization were used, the soft aluminum might be damaged without a hard stop layer disposed on it that is resistant to the planarization step. To create multiple layers, in step 62 the steps of 52 to 60 are repeated for each layer of memory cells in the memory array. To create the dual memory cell structure using multiple layers of memory cells, each alternating layer of electrodes is oriented substantially orthogonal to the previous layer of electrodes.

By using the embodiments of the invention, a memory cell that includes a state-change element can program data by using an increased electric field created by a physical feature of the conductive traces (electrodes) used for the row and column signals. Preferably, the physical feature is at least one edge of the electrode. By using this method of programming to program data into the memory cell, the thermal energy presented to the state-change element is increased due to the concentration of the electric field caused by offsetting the control element in relation to the state-change element. The offsetting further causes the thermal conduction to be limited by not having the entire surface area of the control element disposed on the conductive row and column traces. The concentration of the electric field and the associated electron crowding enables more efficient localized tunneling, heating, and a resultant junction fusing with less energy than conventional designs. The time required to program information or data into the memory is reduced because of the need for less energy thereby improving write speed which becomes ever more important as the amount of memory increases. Additionally, by using multiple layers, the cost of creating large arrays of memory decreases.

It should be noted that it would be obvious to those skilled in the art that many variations and modifications may be made to the disclosed embodiments without substantially departing from the invention. All such variations and modifications are intended to be included herein within the scope of the present invention, as set forth in the following claims.

What is claimed is:

1. A memory cell, comprising:
   a first conductor oriented in a first direction and having at least one edge;
   a second conductor oriented in a second direction at a height different than the first conductor;
   a state-change element disposed on the first conductor; and
   a control element disposed between the first and second conductors wherein the control element is partially offset over the at least one edge of the first conductor.

2. The memory cell of claim 1 wherein the first conductor has a plurality of edges and wherein the control element is partially offset over the plurality of edges of the first conductor.

3. The memory cell of claim 1 wherein the plurality of edges of the first conductor intersect.

4. The memory cell of claim 1 wherein the first conductor is a metal from the group consisting of aluminum, copper, silicide and alloys thereof.

5. The memory cell of claim 1 wherein the state-change layer is fabricated by either oxidizing a portion of the first conductor or depositing a thin layer on the first conductor then oxidizing the thin layer.

6. The memory cell of claim 1 wherein the state-change layer is fabricated by depositing state-change material.

7. The memory cell of claim 1 wherein the state-change layer is fabricated by depositing phase-change material.

8. The memory cell of claim 1 wherein the control element is comprised of a morphous or microcrystalline silicon.

9. The memory cell of claim 1 wherein the control element has been fabricated with doping ramped from a first polarity dopant to a second polarity dopant.

10. The memory cell of claim 1 wherein the control element has been fabricated with doping ramped from a first polarity dopant, then substantially no dopant, to a second polarity dopant.

11. The memory cell of claim 1 wherein the control element is a tunnel junction device.

12. The memory cell of claim 1 wherein the state-change layer is a direct tunneling anti-fuse.

13. The memory cell of claim 1 wherein the state-change layer is a dielectric rupture anti-fuse.

14. The memory cell of claim 1 wherein the state-change layer is a LeComber or silicide switch.

15. The memory cell of claim 1 wherein the state-change layer is comprised of phase-change material.

16. A memory array comprised of a plurality of memory cells as in claim 1.

17. The memory array of claim 16 wherein the plurality of memory cells are formed in a three dimensional array.

18. A memory cell, comprising:
   state-change means for programming a memory state with an electric field; and
   means for increasing the electric field to lower the energy required to program the state-change means.

19. A memory cell, comprising:
   a first conductor;
   a second conductor disposed at a second height to the first conductor;
   an state-change element disposed between the first conductor and the second conductor and substantially aligned with and disposed on the first conductor; and
   a control element partially disposed between the first conductor and the state-change element and partially offsetting the state-change element.

20. A memory cell, comprising:
   a first conductor having a first width;
   a second conductor having a second width;
   a control element having a first end surface with first opposite edges spaced-apart by a distance about equal to the first width and second opposite edges spaced apart by a distance equal to the second width where the first end surface is continuous contact with the second conductor, a second end surface; and
   a state-change element connected in series with the control element, the state-change element disposed over the first conductor and partially contacted the second end surface of the control element wherein the control element and the state-change element are offset in vertical alignment.

21. A memory cell, comprising:
   a first conductor having at least one edge;
   a second conductor;
   a control element disposed partially between the first and second conductor and offsetting over the at least one edge of the first conductor; and a state-change element disposed between the first conductor and the control element and overlapping the at least one edge of the first conductor.

22. A memory cell, comprising:

a first conductor capable of creating an electric field;

a second conductor;

means for controlling current connected to the second conductor;

means for storing a state-change using the electric field of the first conductor, said means for storing disposed between the means for controlling current and the first conductor; and means for enhancing the electric field of the first conductor.

23. The memory cell of claim 22 wherein the first conductor includes at least one edge and wherein the means for enhancing the electric field comprises offsetting the means for controlling current over the at least one edge the first conductor.

24. A method of making a memory cell on a substrate, comprising the steps of:

creating a first electrode having at least one edge on the substrate;

then creating a first state-change layer disposed over the first electrode including the at least one edge;

then creating a first control element that is disposed over the at least one edge of the first electrode and partially over first state change layer and offset partially beyond the at least one edge of the first electrode; and then depositing a first dielectric layer over the processed substrate.

25. The method of claim 24 wherein the step of creating a first state-change layer comprises the step of oxidizing the first electrode.

26. The method of claim 24 wherein the step of creating a first state-change layer comprises the step of depositing a phase-change material.

27. The method of claim 24 further comprising the steps of:

planarizing the deposited dielectric layer; and creating a second electrode having at least one edge, the second electrode orthogonal to the first electrode.

28. A method of programming a memory cell having a state-change element, comprising the step of increasing an electric field using a physical feature in a conductive trace contacting the state-change element.

29. A method of programming a memory cell having a state-change element, comprising the step of increasing the thermal energy presented to the state-change element by partially offsetting a control element connected to the state-change element thereby limiting thermal conduction.

* * * * *

UNITED STATES PATENT AND TRADEMARK OFFICE
CERTIFICATE OF CORRECTION

PATENT NO. : 6,549,447 B1
DATED : April 15, 2003
INVENTOR(S) : Fricke et al.

It is certified that error appears in the above-identified patent and that said Letters Patent is hereby corrected as shown below:

Column 10,
Line 8, delete "a morphous" and insert therefor -- amorphous --.
Line 58, delete "contacted" and insert therefor -- contacting --.

Signed and Sealed this

Third Day of February, 2004

JON W. DUDAS
*Acting Director of the United States Patent and Trademark Office*